United States Patent

Throssel

[11] Patent Number: 5,758,537
[45] Date of Patent: Jun. 2, 1998

[54] METHOD AND APPARATUS FOR MOUNTING, INSPECTING AND ADJUSTING PROBE CARD NEEDLES

[75] Inventor: Fred Throssel, Los Angeles, Calif.

[73] Assignee: Texas Instruments, Incorporated, Dallas, Tex.

[21] Appl. No.: 822,960

[22] Filed: Mar. 21, 1997

Related U.S. Application Data

[63] Continuation of Ser. No. 305,798, Sep. 13, 1994, abandoned, which is a continuation of Ser. No. 848,845, Mar. 10, 1992, abandoned.

[51] Int. Cl.$^6$ ............................ B21J 13/08; B21D 7/00
[52] U.S. Cl. ........................ 72/458; 72/479; 72/217; 140/106; 29/242
[58] Field of Search ..................... 72/388, 389, 457, 72/458, 474, 217; 29/242; 140/102.5, 104, 106

[56] References Cited

U.S. PATENT DOCUMENTS

| | | | |
|---|---|---|---|
| 1,682,149 | 8/1928 | Robertson | 72/217 |
| 1,827,363 | 10/1931 | Jacquesson | 72/458 |
| 2,345,102 | 3/1944 | Dick | 72/217 |
| 2,605,665 | 8/1952 | Grenat | 72/458 |
| 3,732,721 | 5/1973 | Cusimono | 72/458 |
| 3,965,720 | 6/1976 | Goodwin et al. | 72/458 |
| 4,589,153 | 5/1986 | Paquette | 72/458 |
| 4,619,132 | 10/1986 | McBee | 72/458 |
| 5,095,995 | 3/1992 | Emery | 72/387 |
| 5,113,685 | 5/1992 | Asher et al. | 72/458 |
| 5,201,210 | 4/1993 | Stein, III | 72/457 |

FOREIGN PATENT DOCUMENTS

| | | | |
|---|---|---|---|
| 566975 | 2/1924 | France | 72/217 |
| 650680 | 1/1929 | France | 72/217 |
| 844851 | 7/1952 | Germany | 72/217 |
| 583961 | 10/1958 | Italy | 72/217 |
| 1293613 | 2/1986 | Japan | 72/458 |

*Primary Examiner*—David Jones
*Attorney, Agent, or Firm*—W. Daniel Swayze, Jr.; W. James Brady, III; Richard L. Donaldson

[57] ABSTRACT

A method and apparatus for mounting, inspecting, and adjusting probe card needles used during testing of fabricated circuits. A build wafer, comprised of build and scrub target patterns, is used to mount and re-work probe needle assemblies onto a probe card. Each build target is composed of a hard material that is resistant to probe needle scratching, and is offset a preset distance from the position of the bonding pads on the actual wafer to be tested. Each scrub target is composed of a soft material that is easily disturbed by the probe needle's scrubbing action. By counting the number of lines broken or cut by a probe needle's scrub mark, the approximate length and width of the scrub mark may be ascertained. An adjustment tool is designed to fit snugly around the untapered, thickest portion of the probe needle. The tool is rotated along the axis of the probe needle shaft, allowing the technician to "tweak" the probe needle either up or down. In one embodiment, the tool consists of a three parallel cylinders, triangularly spaced, and attached orthogonally to the end of an offset lever. The spacing between the cylinders can accommodate the diameter of the thickest portion of a probe needle.

24 Claims, 7 Drawing Sheets

METHOD AND APPARATUS FOR MOUNTING, INSPECTING AND ADJUSTING PROBE CARD NEEDLES

This application is a continuation of application Ser. No. 08/305,798, filed Sep. 13, 1994, abandoned which is a continuation of application Ser. No. 848,845 filed Mar. 10, 1992.

BACKGROUND OF THE INVENTION

1. Field of the Invention

The present invention relates to the field of semiconductor fabrication and testing equipment and, more particularly, to an improved method and apparatus for mounting and adjusting probe card needles used to test fabricated semiconductor wafers.

2. Background Art

One step in the process of semiconductor manufacturing is the testing of circuits fabricated on wafers. During testing, a wafer of monolithic circuits is placed in a holder under a microscope and is tested using a multiple-point probe card. Metal probes are used to contact various bonding pads on an individual circuit, and a series of electrical tests are performed to determine the electrical properties of the selected circuit. Information from these tests is compared with information stored in a memory, and the circuit is either rejected or accepted based on this comparison.

FIG. 1 illustrates a "probe card" probe assembly commonly used to electrically test wafer devices. A probe card is a printed circuit board that can be used in conjunction with standardized testing equipment to test the electrical properties of semiconductor chip devices. A typical probe card contains a plurality of probe assemblies 100–107, matching circuitry, and an interface for attaching the probe card to the testing equipment. Each probe assembly contains a probe needle. During the testing procedure, the probe needle is brought into contact with aluminum bonding pads located on the individual semiconductor circuit 110 so that sufficient electrical contact is established to allow the electrical tests to be performed.

To assure proper contact with the bonding pads, the probe needle tips must penetrate the thin aluminum oxide layer that characteristically forms over the exposed aluminum bonding pads. To do so, probe needles are typically oriented at an angle and are applied to the surface of the wafer with sufficient force so that when the bonding pads of the wafer are brought into contact with a probe needle tip, the probe needle scratches, or "scrubs," the surface of the bonding pad, penetrating any built-up aluminum oxide layer. In addition, all probe needles that contact the bonding pads should be co-planar. That is, the probe needle tips should all lie in a single plane.

A typical probe assembly is shown in FIG. 2. The probe assembly of FIG. 2 consists of a thin metal blade 201 and a specialized probe needle 202. The blade 201 is connected to the matching circuitry and interface 203. The probe needle 202 is attached to the blade 201 at a shoulder 204 at an angle of approximately six degrees below horizontal. The probe needle is typically round in cross section. The probe needle 202 is of uniform diameter from the shoulder 204 to approximately the midsection of the needle. The probe needle 202 is tapered from the midsection to the end of the probe needle tip 205. The tip is typically 7 mils long and is bent at an angle approximately sixteen degrees from vertical. The tip 205 is a part of the needle assembly and is formed by the bend.

As each silicon wafer is tested, the probe assemblies are lowered so that the tips of the probe needles make contact with the semiconductor circuit's aluminum bonding pads. The combination of an untapered needle diameter and the length of the tapered portion of each probe needle gives the probe needle a predetermined amount of flexibility. Each probe needle is designed so that as the probe needle is lowered onto the pad, the probe needle tip "scrubs," or scratches, the surface of the aluminum bonding pad. Scratching is necessary to insure good electrical contact through the surface layer of accumulated aluminum oxide. The probe needle is attached to the blade and the tip is angled from the needle at angles designed to produce the optimum scratch mark on the bonding pad. The angles noted above, six and sixteen degrees, are given by way of example only. Other angles may be used.

When a probe card is first assembled, the probe card technicians must mount each probe needle assembly so that the tip of each probe needle, when lowered, will come in contact with the associated bonding pad on the wafer. Ideally, the probe card needle tip should initially contact the bonding pad at a point approximately ⅓ of the way across the pad, scrub through the center of the pad, and stop at a point approximately ⅔ of the way across the bonding pad. Mounting the probe needle in this manner insures that the needle tip scratches through the oxide layer and makes good electrical contact with the aluminum bonding pad. Unfortunately, it is difficult for the technician to estimate, without the benefit of any reference, the location of a point ⅓ of the way across the bonding pad. In practice, therefore, the technicians are directed to estimate the bonding pad center, and place the needle/blade, or mount the needle in the epoxy ring, so that the probe needle tip will approximately hit the bonding pad center.

FIG. 10 illustrates the different scrub marks created by starting the probe needle tip ⅓ and ½ of the way across the bonding pad 300. In typical probe needle mounting, the needle tip 1001 first contacts the bonding pad 300 in the center, and comes to rest near the edge of the bonding pad box. Because of the needle tip's proximity to the bonding pad edge 1006, "pushed" metal 1002 caused by the scrub may be forced out of the bonding pad area. In ideal probe card needle mounting, the needle tip 1003 first contacts the bonding pad 300 at a point ⅓ of the way across the bonding pad, and comes to rest at a point ⅔ of the way across the bonding pad. A needle mounted in this manner scrubs through the center of the pad, insuring good electrical contact, and comes to rest far enough away from the bonding pad edge 1006 so that the pushed metal 1004 seldom leaves the bonding pad region. Unfortunately, because of the technicians' inability to accurately and consistently estimate a point ⅓ of the way across a bonding pad, the current practice is to mount the probe needles in the center of the bonding pad, as shown by probe needle 1001.

After prolonged use, the probe needle tips of the probe assemblies typically lose co-planarity. Consequently, inaccuracies may occur in testing the circuits because either a higher probe needle tip fails to make sufficient contact to scratch through the layer of aluminum oxide, or a lower probe needle tip scratches the bonding pad excessively, damaging the circuit, or the probe needle tip, or both.

To prevent these testing inaccuracies from occurring, probe card technicians monitor the wafer testing procedure and ensure that the probe needle tips remain co-planar. In the prior art, technicians select a representative wafer at random from the group of wafers that have already been tested with the probe card. The technicians re-planarize the probe card needle tips at a planarization station. One type of planarization station is called a light box. The probe card is lowered onto chucks that are grounded to a set of light emitting diodes (LED). Each time a probe needle touches a chuck an LED lights up. The amount of travel between the point where the first LED illuminates and the last LED illuminates represents the planarity error. The technicians adjust the angle and position of each probe needle until the planarity error is within a specified range.

Next, using a low magnification microscope, the technicians inspect the surface of the wafer's bonding pads. By looking at the length and character of the scrub marks on each bonding pad, the technician performs a visual probe mark "footprint analysis" without the benefit of any specific visual reference. The technician typically is directed to look for actual presence and general location of the probe needle scrub marks. For example, a technician may be directed to make sure that less than 50% of each scrub mark is outside the bonding pad without cutting neighboring metal runs more than 50%. The technicians also look for overdrive damage (indicated by passivation exposure), and side to side scrub patterns that may indicate planarity problems. Of course, the relatively small size of the bonding pad (approximately 4×4 mils) increases the difficulty of accurate footprint analysis.

One disadvantage of the prior art needle mounting and scrub mark inspection technique is that it is a subjective probe mark analysis that does not set any specific minimum or maximum limit to the length or difference in the acceptable scrub marks. A very short "dot" scrub mark indicates the absence of any oxide breaking scrub action, possibly preventing the probe needle from making good electrical contact with the bonding pad, and leading to the unwitting failure of a good wafer during testing. A long probe mark indicates excessive chuck travel, loss of probe needle tip planarity, or improper needle angle. In current practice, only scrub mark presence and location (but not length) are considered. Planarity checks are typically performed to determine accurate needle height placement. However, these planarity checks do not take into account actual needle length, loose probes, different needle gram force ratings, different taper lengths, defective probe card pads, epoxy plasticity, needle tip shape or diameter, or false readings due to needle contact anomalies, improper set-up, or equipment manufacturers' tolerance drift. The typical result is a probe card that, while being perfectly planarized, has widely varying scrub marks.

Further, as the probe needle is driven past initial wafer contact, it moves towards the center of the needle pattern. This over-travel (typically 3 mils) pushes the needle from pad center towards, and sometimes beyond, the inside edge of the bonding pad. This may result in pushed aluminum shorts, metal migration problems over time, loss of probe contact, burn-in failures, loose aluminum flakes inside packages, reductions in reliability, cut metal runs, and optical inspection rejects. To complicate the situation, as each probe needle wears, it also recedes towards the outside of the bonding pad box. This is partially offset by probe needle stress relaxation which decreases the average needle tip to probe card distance thereby effectively moving the needle tip array in towards the center of the needle pattern. At present, no current method allows and operator to place a probe needle in the ideal location (outer ⅓ line of the bonding pad box), resulting in improperly and/or inconsistently placed needles. Although epoxy cards allow accurate probe placement during assembly, these cards are typically mounted in the center of the bonding pad.

Prior art tools are currently available to adjust, or "tweak," the probe needles. These tools allow the technicians to push, pull, or twist the needles in any location or manner deemed best by the technician. The thinner midsection and tapered portions of the probe needle are more flexible than the thicker, untapered portion. Using these prior art tools, technicians typically adjust the probe needles where it is easiest for them to do so, that is, near the probe needle tip, where the probe needle is thinnest and easiest to bend. Due to the currently available tool inadequacies, some technicians even adjust the probe needles using home-made tools made from tweezers or needles.

Ideally, any adjustments to the probe needle should be made at the non-tapered portion of the needle or "shoulder" 204, where the probe needle 202 attaches to the probe card blade 201. Adjustments made at this location will have a minimum effect on the probe needle's flexibility and angle of attack. However, this type of bend in the thicker portion of the probe needle is very difficult to attain using any of the currently available tools.

The disadvantages of the prior art adjustment tools are multiple. Flexibility of the probe needle is provided by its tapered end portion. Consequently, any adjustments made to this critical area causes an intensified change in the probe needle's rated modulus of elasticity. The modulus of elasticity determines the amount of force to be applied by the probe needle tip, for a given needle diameter at a given overtravel setting. The preservation of this flexibility is critical in producing and maintaining a proper scratch mark on the bonding pad. Additionally, adjustments along the probe needle's tapered portion have a multiplied effect on the needle's angle of attack and scrub rate. When the technicians use the prior art tools to pull or push the probe needle along the tapered portion, distributed arc bends are typically applied to the probe needle. Arc bends have an intensified effect on the probe needle's modulus of elasticity, and also reduce the probe needle's ability to properly maintain or hold adjustments.

The prior art mounting, inspection, and adjusting techniques lead to inconsistent maintenance results and, thus, more frequent needle adjustment cycles and more down time in the wafer testing procedure. Inaccurate probe needle adjustments decrease wafer yield due to insufficient or excessive scrubbing between the probe needle tip and each circuit's bonding pads. In addition to this risk of reduced electrical test yield, the wafers may be rejected for visual damage. Costly rework is an option if the damage is less than specification limits. However, some military specifications prohibit rework by disallowing a second set of probe works on certain devices. Wire bonding integrity is tested by pull testing that is dependant on the presence of aluminum (without passivation exposure) in the "center" of the die. Unfortunately, this area is typically exposed by low or overdriven probes. Apparent yield improvement typically encourages the technicians to improperly perform overdrive increases made to "chase" a high or light probe needles. However, visual rejects and poor wire bond integrity result even if only one probe is overdriven.

SUMMARY OF THE PRESENT INVENTION

The present invention discloses a method and apparatus for mounting, inspecting, and adjusting probe needles at or near the point where the probe needle is attached to the probe blade or epoxy ring. In the preferred embodiment of the present invention, a build wafer, comprised of build target patterns and scrub target patterns, is used to initially mount, and to subsequently re-work, probe needle assemblies on a probe card. A tweaking tool is designed to fit properly only when it is placed over the thickest portion of the probe needle, the present invention encourages the wafer testing technician to adjust each probe needle at the proper location.

Each build target is composed of a hard material that is resistant to probe needle scratching, and is offset a preset distance from the position of the bonding pads on the actual wafer to be tested. By positioning the probe needle tip in the center of the build target, the probe needle is automatically and accurately positioned so as to scrub through the center ⅓ of the bonding pad box. In the preferred embodiment, each build target is in the shape of a "fat" plus sign, and is composed of chromium.

Each scrub target is composed of a soft material that is easily disturbed by the probe needle's scrubbing action. In the preferred embodiment, the scrub target is a matrix of crossing lines, spaced 0.5 mils apart, and composed of aluminum. By counting the number of aluminum lines broken or cut by a probe needle's scrub mark, the approximate length and width of the scrub mark may be ascertained to quickly and accurately determine whether it falls within a specified range.

One aspect of the present invention allows tweaking of the probe needle at, or close to, the blade/probe needle junction, or the holding ring on epoxy type cards, thus minimizing the adjustment's impact on the probe needle's effective angle of attack. Because it adjusts the needle properly, the present invention increases the accuracy of the testing procedure, and extends the time between adjustment cycles, thereby increasing wafer yield. Post-probe inspection, wire bonding, and other processing steps realize benefits.

In the present invention, the tool is designed to fit snugly around the untapered, thickest portion of the probe needle. The tool is rotated along the axis of the probe needle shaft, allowing the technician to tweak the probe needle either up or down. The technician's tendency to push, pull or twist the probe needle is avoided. Use of the present invention results in a "kink" bend instead of a distributed arc bend, thereby minimizing the adjustment's effect on the probe needle's modulus of elasticity, force rating and angle of attack. The point of the "kink" is focused close to the blade (or ring)/probe needle junction, and away from the more sensitive midsection and tapered portion of the probe needle.

In the preferred embodiment of the present invention, the tool consists of a three parallel cylinders, triangularly spaced, and attached orthogonally to the end of an offset lever. The spacing between the cylinders is such as to accommodate the diameter of the thickest portion of a probe needle.

DETAILED DESCRIPTION OF THE PRESENT INVENTION

A means for tweaking a probe card needle, and method and apparatus for mounting and inspecting probe card needles used in the electrical testing of a silicon wafer is described. The present invention is used to facilitate and simplify the mounting and adjustment of a probe needle along its thickest, untapered portion. In the following description, numerous specific details are described, such as the probe needle's angle of attack, bonding pad dimensions, etc., in order to provide a thorough understanding of the present invention. It will be obvious, however, to one skilled in the art, that the invention may be practiced without these specific details. In other instances, well known features have not been described in detail in order not to unnecessarily obscure the present invention.

In semiconductor fabrication, each monolithic circuit on a silicon wafer must be tested in various ways before it passes final inspection. One test that is performed is an electrical test. A series of tests are performed to quality check the electrical characteristics of devices located on the wafer. To facilitate these electrical tests, each device includes bonding pads that are electrically connected to the device.

Figure 3:
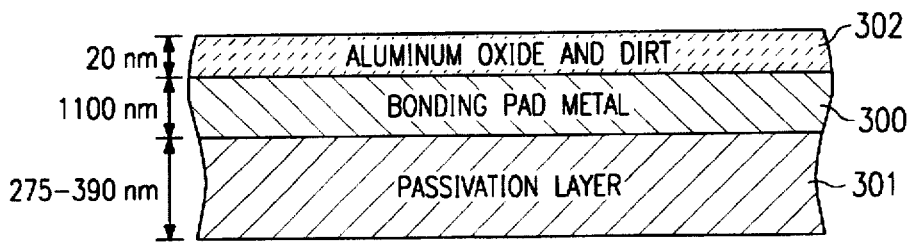
FIG. 3 illustrates the various layers of material that comprise a semiconductor circuit's bonding pads.

A cross-section of a bonding pad is illustrated in FIG. 3. The bonding pad 300 is comprised of metal, typically aluminum or some other conductive material, and is approximately 1100 nanometers in depth. The bonding pad 300 is positioned over a passivation layer 301 which is typically 275-390 nanometers deep. During the wafer testing process, the wafer surfaces are exposed to air. Accordingly, a thin layer 302 of aluminum oxide (and dirt) forms on the exposed surface of the bonding pad. The aluminum oxide and dirt form a layer 302 on the topmost surface of the bonding pad 300 that is typically 20 nanometers in depth.

Figure 1:
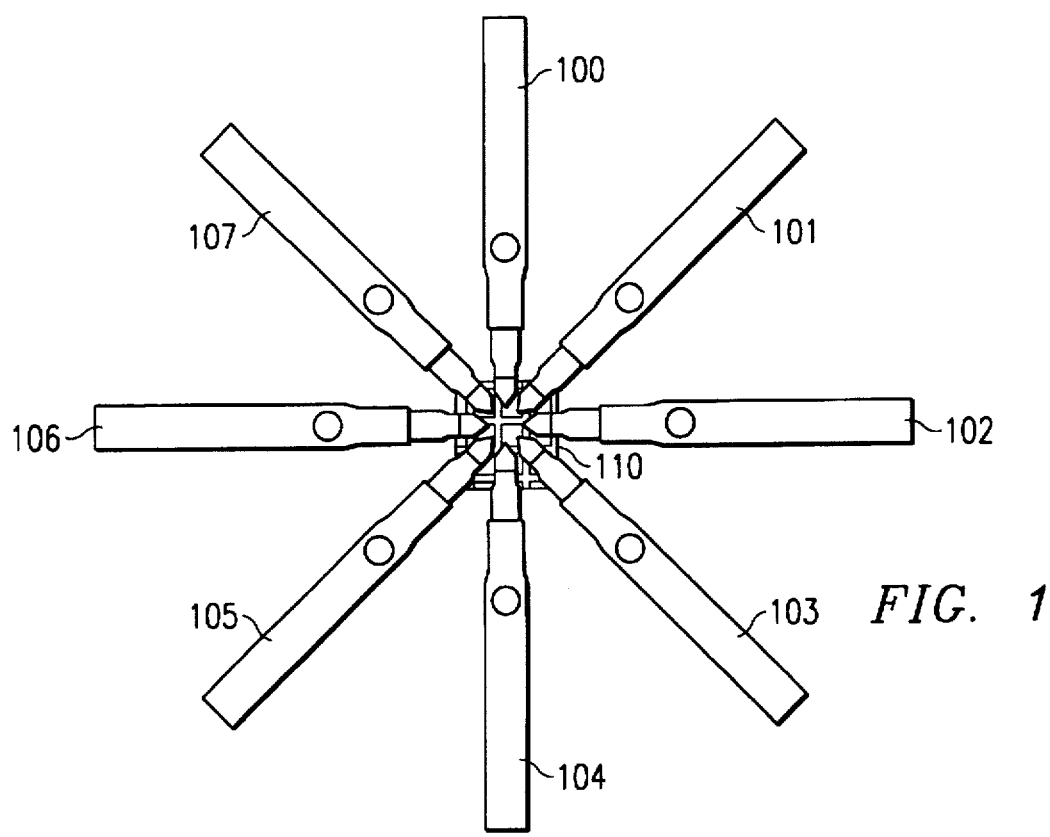
FIG. 1 illustrates a probe card.

One apparatus commonly used in wafer fabrication to electrically test each wafer is called a "probe card." FIG. 1 illustrates a probe card. The probe card is a printed circuit board that can be used in conjunction with standardized test equipment to test the electrical properties of various semiconductor chip devices. Although probe cards vary in design, a typical probe card consists of a plurality of probe assemblies 100-107, matching circuitry, and some type of interface for connecting the probe card to the testing equipment. Each probe assembly contains a probe needle attached to a blade (on blade cards) or ring (on epoxy cards).

Figure 2:
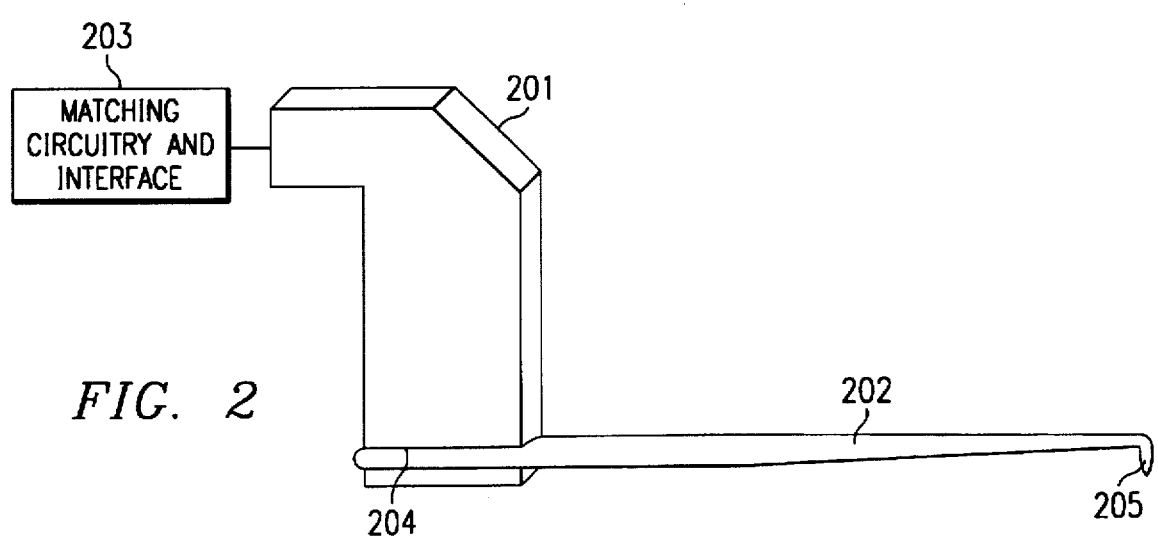
FIG. 2 illustrates a probe card assembly.

A blade card probe assembly is illustrated in FIG. 2. The blade 201 is comprised of a thin piece of metal which is bent downward at a right angle toward the wafer surface. One end of the blade 201 is attached to the matching circuitry and interface 203 and the other end is attached to the probe needle 202. The probe needle 202 is attached to the shoulder 204 of the blade or epoxy ring 201 so that the probe needle 202 points downward at a slight angle below horizontal. A typical angle that a probe needle might be attached is six degrees below horizontal.

The probe needle 202 is of uniform dimension from the blade/probe needle junction 204 to a point near the midpoint of the probe needle. From the midpoint to the end of the probe needle immediately above the probe needle point 205, the probe needle 202 tapers significantly. A typical probe needle is 0.250" long, and may vary in cross section from 0.010" at the thickest end to 0.002" at the tapered end. The length of the untapered portion of the probe needle typically varies with the manufacturer's or end user's requirements to yield a specific applied gram force (longer taper gives less gram force). Typically, the probe needle point 205 is bent at an angle of approximately seventy-four degrees from horizontal.

The matching circuitry and interface 203 is connected to standardized testing equipment. The equipment is programmed to generate a series of varying electrical currents and voltages. These electrical signals are transmitted to the device circuitry through the probe card needles. Each device's electrical responses to these signals are similarly received by the testing equipment through the probe needles.

Because of the fine nature of each device's circuit structure and the subtlety of the electrical signals and responses involved, it is imperative that the probe needle tip 205 make sufficient electrical contact with the aluminum (or gold) bonding pad 300. The probe needle shaft is tapered to impart a predetermined amount of force at the tip 205. The flexibility of the probe needle 202 is governed by the probe needle material's modulus of elasticity and taper length. Each probe needle is designed to impart a selected amount of force at the probe needle tip when the the probe needle is properly installed and fully lowered to make contact with the device's bonding pads. The amount of force applied at the probe needle tip is called the force rating of the probe needle, and is normally given in g/mil. The probe needle manufacturer strictly controls the tapering of the probe needle shaft so that each probe needle's modulus of elasticity and force rating are within certain prescribed tolerances. Depending on the wafer structure and the testing equipment used, probe needles of varying force ratings may be used to test the wafer devices.

Figure 4A:
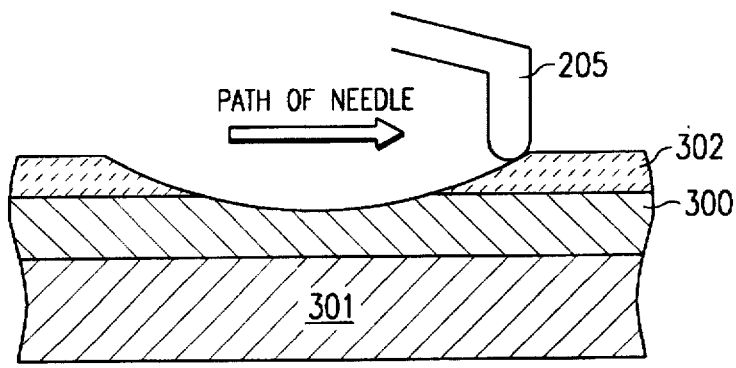
FIGS. 4A-4C illustrate bonding pad scratch marks resulting from varying a probe needle's angle of attack.
Figure 4B:
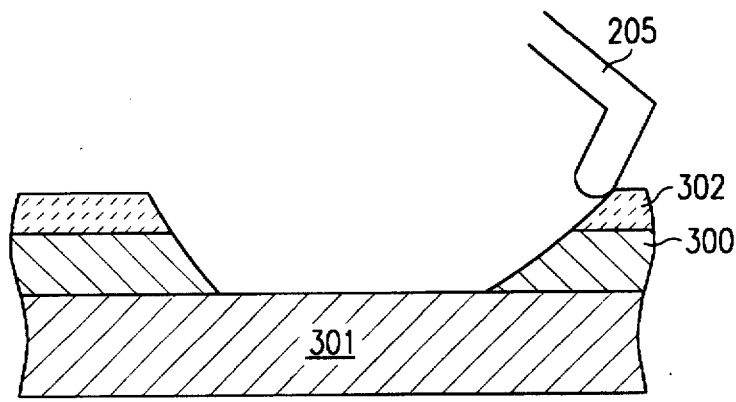
Figure 4C:
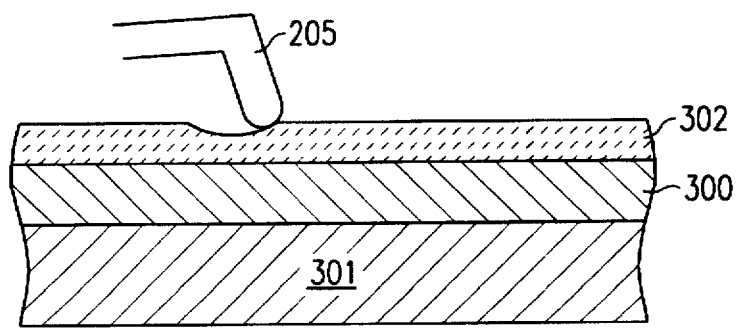

The angle at which the probe needle 202 is mounted, and the angle at which the tip 205 is bent, are both critical in determining whether the probe needle tip makes sufficient electrical contact with the aluminum bonding pad. Together, these angles comprise the probe needle's "angle of attack." FIGS. 4A–4C show the resulting scratches produced from differing angles of attack. Referring to FIG. 4A, at the proper angle of attack, the probe needle tip 205 penetrates the accumulated aluminum oxide and dirt layer 302 and makes electrical contact with the conductive layer 300 of the bonding pad. At the proper angle of attack, the probe needle tip 205 does not scratch the passivation layer 301.

If the angle of attack is too steep, with the probe needle tip 205 rotated toward the wafer surface as in FIG. 4B, the probe needle tip 205 may scratch too deeply into the passivation layer 301, damaging the bonding pad and possibly the device itself. Because the probe needle tip 205 has scratched through the conductive layer 300 of the bonding pad, the probe card is unable to accurately transmit or receive electrical signals to or from the bonding pad.

As illustrated in FIG. 4C, if the angle of attack is too shallow, in other words, if the probe needle tip 205 is rotated up, away from the wafer surface, the probe needle tip 205 may not be able to scratch through the upper layer 302 of aluminum oxide and dirt to make sufficient electrical contact with the conduction layer 300. Because the probe needle tip 205 fails to make contact with the conductive layer 300 of the bonding pad, the probe card is unable to accurately transmit or receive electrical signals to or from the bonding pad.

Figure 5A:
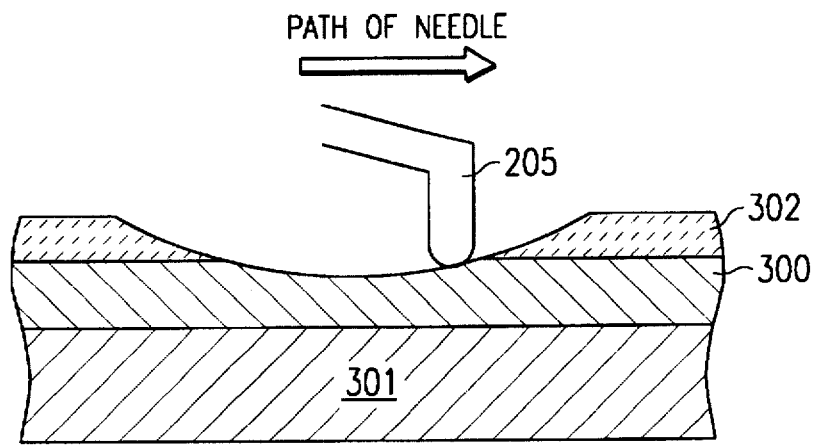
FIGS. 5A-5C illustrate bonding pad scratch marks resulting from varying a probe needle's force rating.

The force rating of the probe needle also determines whether the probe needle will make sufficient electrical contact with the aluminum bonding pads. FIG. 5A shows the resultant scratch mark when the force rating is correct. The probe needle scratches through the aluminum oxide layer 302 and "contacts" the conducting layer 300.

Small changes in the probe needle's force rating can have undesirable results. For example, if the force rating is too low as in FIG. 5B, the probe needle tip 205 may not be able to scratch through the layers of aluminum oxide and dirt 302 to make contact with the conductive layer 300 of the bonding pad. As in FIG. 4C, insufficient scratching due to a decrease in the force rating leads to inaccurate test results.

Figure 5B:
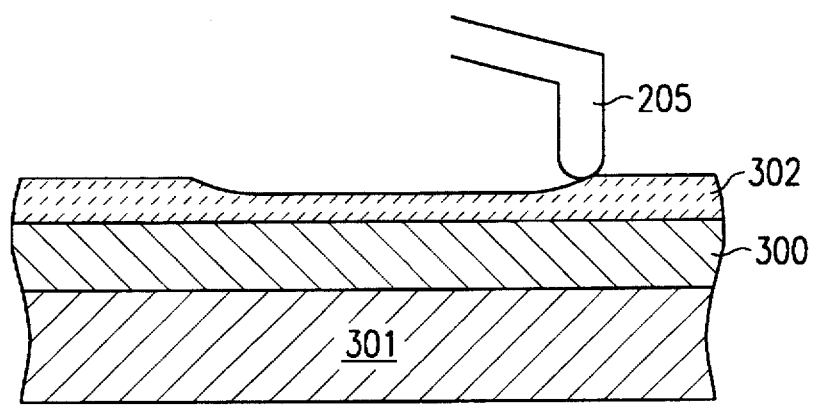
Figure 5C:
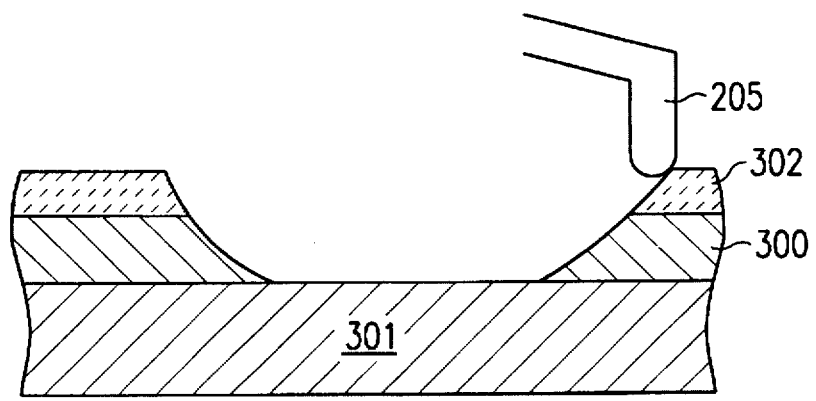

If the force rating is too high as in FIG. 5C, the probe needle tip 205 scratches too deeply, all the way to passivation layer 301, damaging the bonding pad and possibly the device itself. As in FIG. 4B, excessive scratching leads to inaccurate test results. Thus, it can be seen that any significant change in the probe needle's angle of attack or force rating may have a detrimental effect on the needle's ability to make proper electrical contact with the bonding pad.

In order to achieve accurate results from the testing equipment, all of the probe card's probe needle tips must be co-planar. If the probe needle tips are not co-planar, the tips will produce nonuniform scratch marks on the bonding pads, causing variation in the quality of the electrical contact made by each probe needle tip. A needle that is positioned higher than the other probe needle tips will insufficiently scratch the bonding pad, or may fail to make any contact whatsoever. A probe needle that is positioned lower than the other probe needle tips will excessively scratch or damage the bonding pad or device. Thus, it is important that each probe needle is accurately adjusted to be co-planar with the other probe card needles. Unfortunately, each time a probe needle is adjusted its force rating is correspondingly affected. If the probe needle adjustment occurs in the tapered portion of the probe needle, the effect on the needle's force rating is even more pronounced. It is therefore desirable to mount and adjust the probe needles accurately, both during new builds and during re-workings, so as to reduce the number of future adjustments required. It is also desirable to avoid making any adjustments to the probe needle along its tapered portion.

In the prior art, technicians monitor the testing of each wafer and adjust, or "tweak," the probe needles when the probe needle tips are no longer co-planar. Because the needles are small, typically 0.250" in length, the probe needles are difficult to accurately adjust by hand. Further, the probe needles bend easiest along the tapered portion of their shaft. The thickest, untapered portion of the probe needle is more rigid and does not bend as easily.

Currently available tweaking tools are tweezer, hook, or split tongue/"V" shaped. These tools allow the technician to pull, push, or twist the probe needles into planarity in whatever location or manner that the technician deems appropriate. Because the tools are capable of grasping the probe needle anywhere along its length, the technicians typically adjust the probe needle where it is easiest: along the more flexible tapered portion of the probe needle, and often near its tip.

Figure 6A:
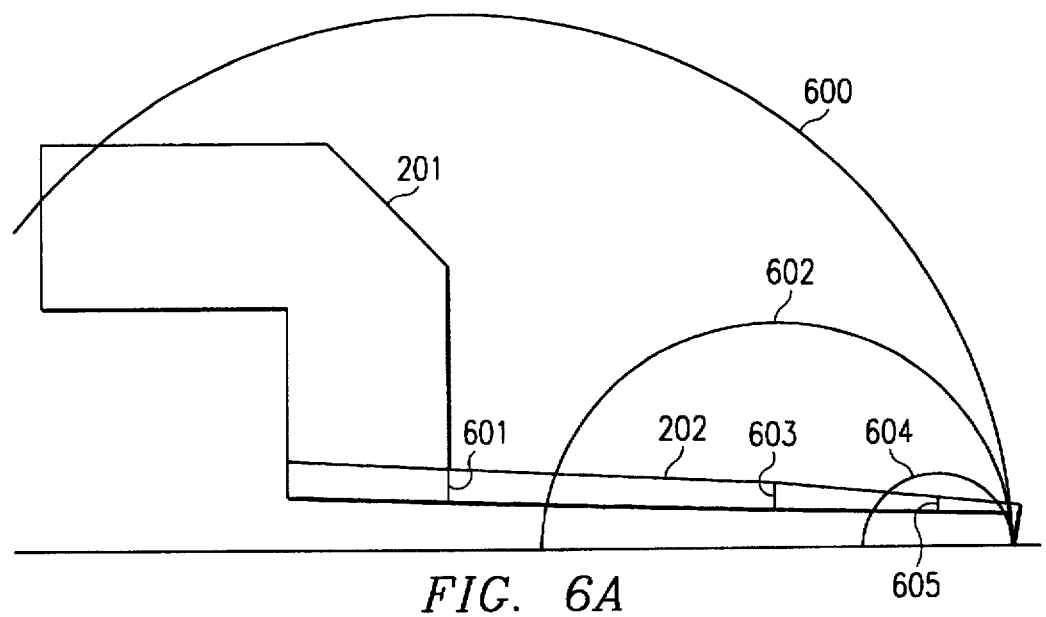
FIGS. 6A-6B illustrate the differing effects of three adjustment points on a probe needle's angle of attack and force rating.
Figure 6B:
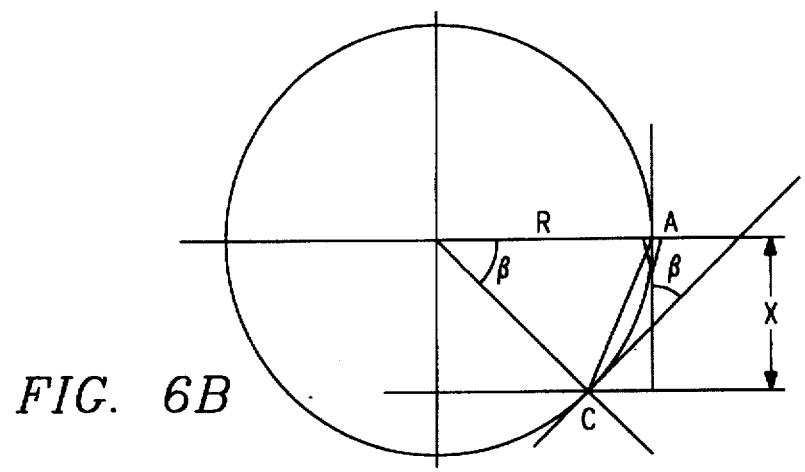

The prior art tools are most easily used to bend the probe needle along its more fragile, tapered portion. The part of the needle that is designed to flex the most, during contact with the wafer, is this tapered portion. Any change made to this critical area has a magnified effect on the probe needle's angle of attack. To illustrate this, a probe card assembly is shown in FIG. 6A with three options for applying a planarization tweak to the probe needle 202. Suppose a technician wishes to lower the tip of the probe needle X millimeters by applying an adjustment at a point R millimeters from the end of the probe needle. As shown in FIG. 6B, a technician applies $\beta$ radians of adjustment to lower the needle tip X millimeters.

For $X<<R$, $X \approx chord_{AC}$

For $\beta<<1$ radian, $chord_{AC}=2R\sin(\beta/2) \approx \beta R$

Thus, $X \approx \beta R$ for $X<<R$ and $\beta<<1$ radian.

Thus, to lower the probe needle tip X millimeters, the technician would need to apply $\beta=X/R$ radians of adjustment at a point R millimeters from the tip 205 of the probe needle. Unfortunately, as shown in FIG. 6B, a probe needle adjustment of $\beta$ radians correspondingly changes the probe needle's angle of attack by $\beta$ radians. Thus, for a given adjustment, the closer the point of adjustment is to the end of the probe needle, the greater the change in the probe needle's angle of attack. Conversely, the farther the adjustment point is from the end of the probe needle, the smaller the change in the probe needle's angle of attack.

Assume that in FIG. 6A point 601 is located near the probe needle/blade junction 204, point 603 is located at the beginning of the tapered portion of the probe needle, halfway between point 601 and the needle tip 205, and point 605 is located near the middle of the tapered portion of the probe needle, halfway between point 603 and the needle tip 205. To lower the probe needle tip 205 X millimeters, the technician applies a replanarization tweak of $\beta=X/R$ $=X/R_{601}$ radians at point 601, where $R_{601}$=the distance from point 601 to the probe needle tip 205. Thus, the probe needle's angle of attack will be changed by $X/R_{601}$ radians. The resultant arc 600 is shown in FIG. 6A, and is achieved by applying a bend at, or near, the blade/probe needle junction 204. A bend at point 601, near the blade junction, is difficult to make with the currently available standard tools.

If the technician applies a tweak at point 603, then the probe needle's angle of attack is changed by $\beta=X/R_{603}$ radians, where $R_{603}$=the distance from point 603 to the probe needle tip 205. However, point 603 is halfway between point 601 and the probe needle tip 205, so that $R_{601}=2R_{603}$. Thus, an adjustment made at point 603 changes the probe needle's angle of attack twice as much than an adjustment made at point 601. Similarly, because $R_{601}=2R_{603}=4R_{605}$, an adjustment made at point 605 changes the probe needle's angle of attack by twice as much than an adjustment made at point 603, and four times as much than an adjustment made at point 601. The arcs 602 and 604 show the result of bends made at point 603, the start of the tapered portion of the probe needle, and at point 605, in the middle of the tapered portion of the probe needle. As can be seen from FIGS. 6A and 6B, small adjustments made near the probe needle tip 205 causes large changes in the tip's angle of attack.

Tweaks applied along the critical tapered portion also have a detrimental effect on the probe needle's force rating and modulus of elasticity. The probe needle is manufactured so that the most flexible part of the probe needle is along its tapered shaft. Each time a technician applies pressure along the tapered portion, the probe needle's force rating is irreversibly altered. As shown in FIGS. 5A–5C, an increase in the probe needle's force rating may cause the needle tip to scratch the bonding pad too deeply, while a decrease in the force rating may cause the needle tip to scratch insufficiently and fail to make proper electrical contact.

Still another disadvantage of prior art tweaking tools is that adjustments made with these tools result in distributed arc bends to the probe needle shaft. In other words, during adjustment, the technician bends the probe needle both at the point of tool application and, to a varying degree, along the entire needle shaft. Bending the entire needle shaft changes the probe needle's force rating and reduces the probe needle's ability to maintain or hold an adjustment. Use of the prior art tweaking tools leads to a decrease in wafer yield due to insufficient contact between the probe needle and the bonding pad, pushed or overdriven probe marks, an increase in the number of probe needle realignment cycles, and inconsistent wafer testing results.

The present invention overcomes the disadvantages of the prior art. The present invention fits snugly and properly only when it is placed over the thickest, untapered portion of the probe needle, thus encouraging technicians to adjust the probe needle at the proper location. The present invention facilitates the application of a probe needle adjustment "tweak" at the point where the untapered portion of the probe needle contacts the cantilever anchor point. As shown in FIG. 6, tweaks occurring at, or near, the anchor point 601 have little effect on the angle of attack. Thus, adjustments made with the present invention have a much smaller effect than the prior art on the probe needle's angle of attack.

Figure 7A:
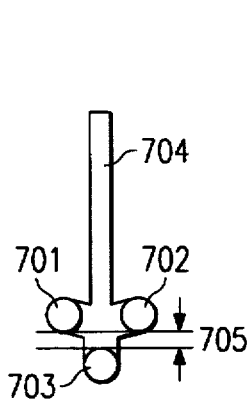
FIGS. 7A-7C illustrate the preferred embodiment of the present invention.
Figure 7B:
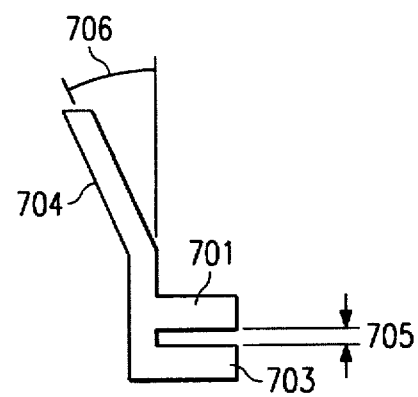
Figure 7C:
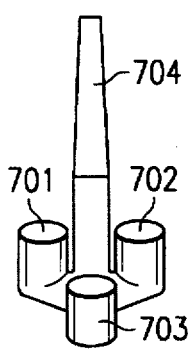

The preferred embodiment of the probe card needle tweaking tool is illustrated in FIGS. 7A–7C. FIG. 7A shows a front view of the preferred embodiment. Three parallel uniform cylinders 701–703 are attached orthogonally to the base of an offset lever 704. One of the cylinders 703 is positioned at the end of the lever 704, while the other two cylinders 701 and 702 are positioned on either side of the lever 704 at equal distances from the bottom cylinder 703 so that the three cylinders are triangularly spaced. The three cylinders 701–703 are positioned so that joining the centers of the three cylinders forms a triangle. The spacing 705 between the two top cylinders 701 and 702 and the bottom cylinder 703 is equal to the thickness of the thickest, untapered portion of the probe needle. Each cylinder is longer than the maximum horizontal width of the probe needle. The lever 704 is positioned in line with the lower cylinder 703, and between top cylinders 701 and 702.

FIG. 7B shows a side view of the preferred embodiment. The end of the lever 704 that is not attached to the cylinders is offset by an angle 706 from vertical. The lever is bent away from the open face of the tool. The top cylinders 701 and 702 are parallel and co-planar. FIG. 7C shows a perspective view of the preferred embodiment.

In the preferred embodiment, the tool is made of tempered tool steel. The handle 704 is approximately 2 ¼ inches long. The spacing 705 between the top two cylinders, 701 and 702, and the bottom cylinder 703 is equal to 0.010" to accommodate the height 903 of the untapered portion of the typical probe needle. The cylinders can also be spaced at 0.012" to accommodate larger needles, such as those made from BeCu. Each cylinder is approximately 0.010–0.012 inches long (corresponding to the needle width) and 0.012–0.015 inches in diameter. The handle 704 is offset at an angle 706 of 37° from vertical so that it does not interfere with various testing equipment, such as the microscope that the technicians use for viewing planarity of the probe needle tips.

Figure 9:
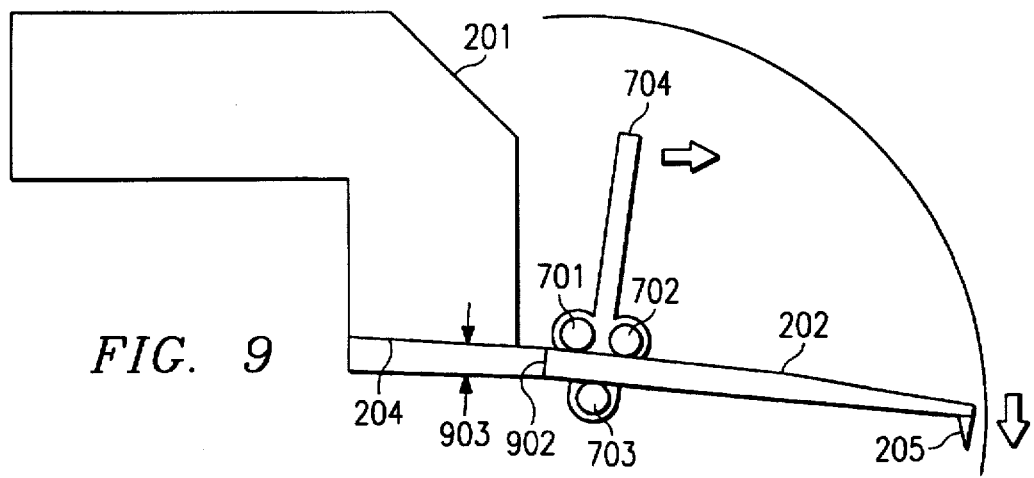
FIG. 9 illustrates application of the present invention on a probe needle.
Figure 10:
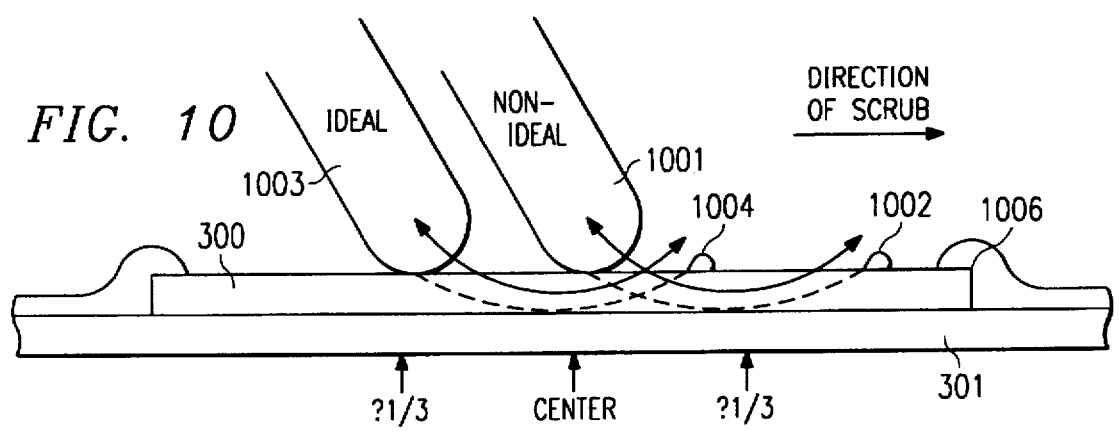
FIG. 10 illustrates two possible scrub marks created as a result of two different probe needle positions.

Once the tool is properly positioned on the untapered portion of the probe needle, the tool is rotated in an X-Z direction to tweak the probe needle up or down. Viewed from the side, this means that the projecting tool handle is moved in a clockwise or counterclockwise direction. Moving the tool handle toward the blade or mount adjusts the probe needle upwards. Moving the tool handle away from the blade or mount adjusts the probe needle downwards. As shown in FIG. 9, the present invention places a "kink" or point bend 902 into the probe needle shaft. The closer the tool is positioned to the needle mount, the closer the "kink" is placed towards the needle's junction with its anchor point 601.

Further, contrary to the prior art tools that apply distributed arc bends to the entire length of the probe needle, the present invention applies a "kink" or point bend only along the untapered portion of the probe needle. Consequently, probe needle adjustments made with the present invention have little or no effect on the probe needle's force rating or modulus of elasticity, and do not effect the probe needle's ability to maintain or hold a tweaking adjustment. Further, a probe needle adjusted with the present invention remains correctly aligned for longer periods of time and continues to apply the proper amount of pressure at the probe needle tip to ensure sufficient electrical contact with the bonding pad.

The blade/probe needle junction is a desired location to place an adjustment bend because tweaking the probe needle at this point produces the minimum effect on the probe needle's angle of attack and force rating. Proper use of the present invention places the adjustment bend along the thickest, strongest, untapered portion of the probe needle, and does not bend the more fragile, tapered portion of the probe needle. A "kink" bend in the thick portion of the probe needle is very difficult to attain using any of the currently available tweaking tools. Adjusted with the present invention, the probe needle maintains and holds adjustments for longer periods of time. The permanency of these adjustments extends the amount of time between successive re-planarization cycles. The present invention more accurately adjusts the probe needle, thereby improving the integrity of the testing procedure and positively impacting several other areas: line item performance, cycle time, over-driven probes, gate reject occurrences, wafer yield, rework, wire bonding and overall quality.

To tweak the probe needle using the present invention, the tool is positioned so that the untapered portion of the probe needle shaft 202 fits between the two top cylinders, 701 and 702 and the bottom cylinder 703, as shown in FIG. 9. The two top cylinders, 701 and 702, are situated above the probe needle shaft 202, and the bottom cylinder 703 is situated below the probe needle shaft. The handle 704 of the tool is orthogonal to the probe needle shaft 202. The tool is positioned as close as possible to the point where the probe needle 202 is attached to the probe card blade 201. Because the gap 705 between the top and bottom cylinders is equal to the vertical height 903 of the untapered portion of the probe needle, the tool fits snugly around the probe needle shaft once it is positioned near the blade. The tool will not fit properly if it is positioned around the smaller, tapered portion of the probe needle shaft. This feature of the tool encourages the technician to tweak the probe needle in the proper location, away from the critical tapered portion of the probe needle. Consistency among technicians is more easily realized.

Figure 11:
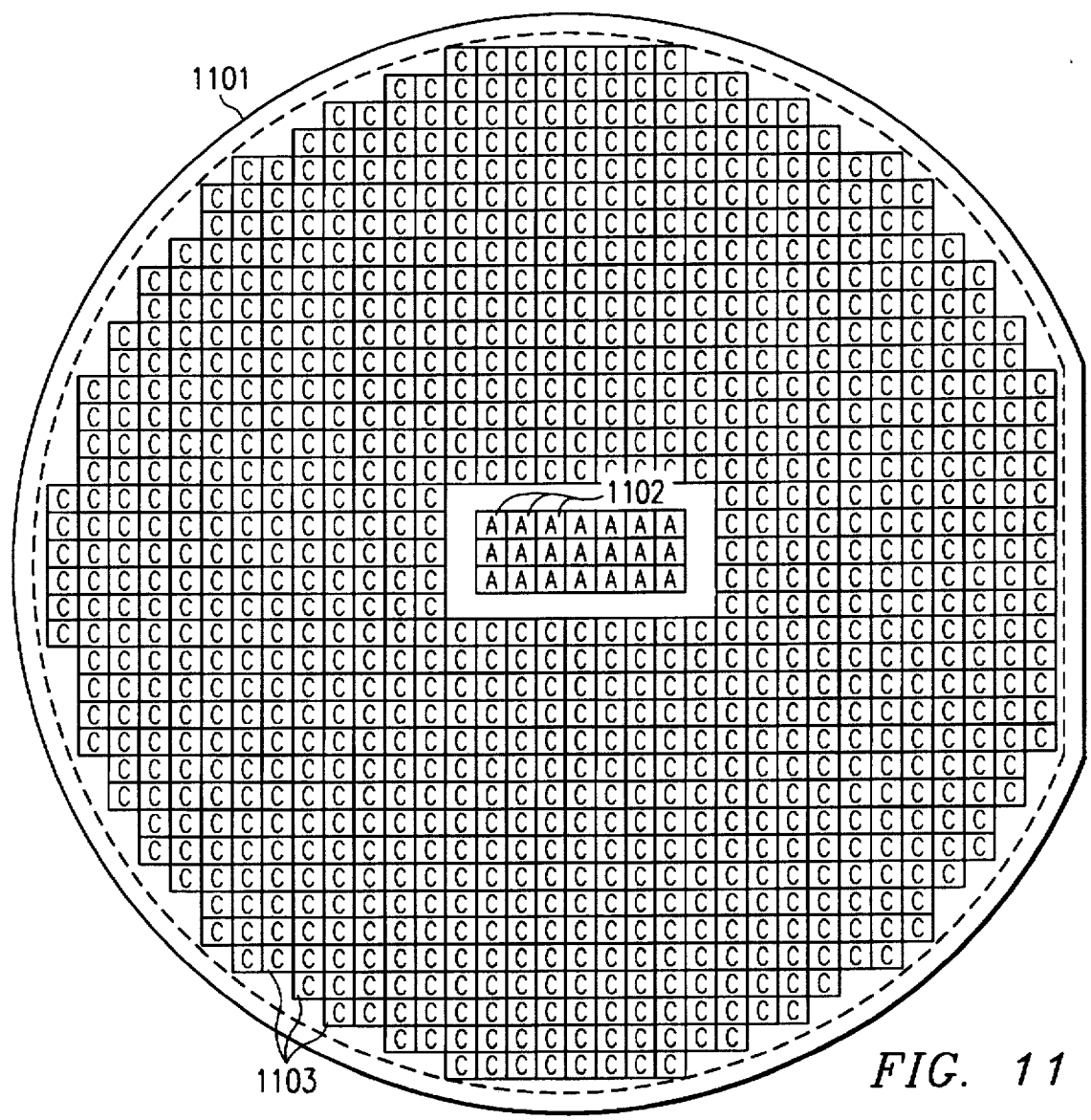
FIG. 11 illustrates the build wafer of the preferred embodiment of the present invention.

Another embodiment of the present invention is illustrated in FIG. 11. To facilitate the technicians in properly locating and monitoring the probe needle scrub marks, the embodiment consists of a special build and analysis wafer 1101 containing two analysis patterns. This wafer closely resembles an integrated circuit wafer. In the center of the special wafer 1101 are several hard chrome needle placement patterns 1102 that allow repeated needle placements during probe card builds without damaging the bonding pad. Surrounding the placement pattern, and in much greater abundance, are soft aluminum scrub target patterns 1103 that facilitate accurate efficient scrub mark footprint analysis.

Figure 12:
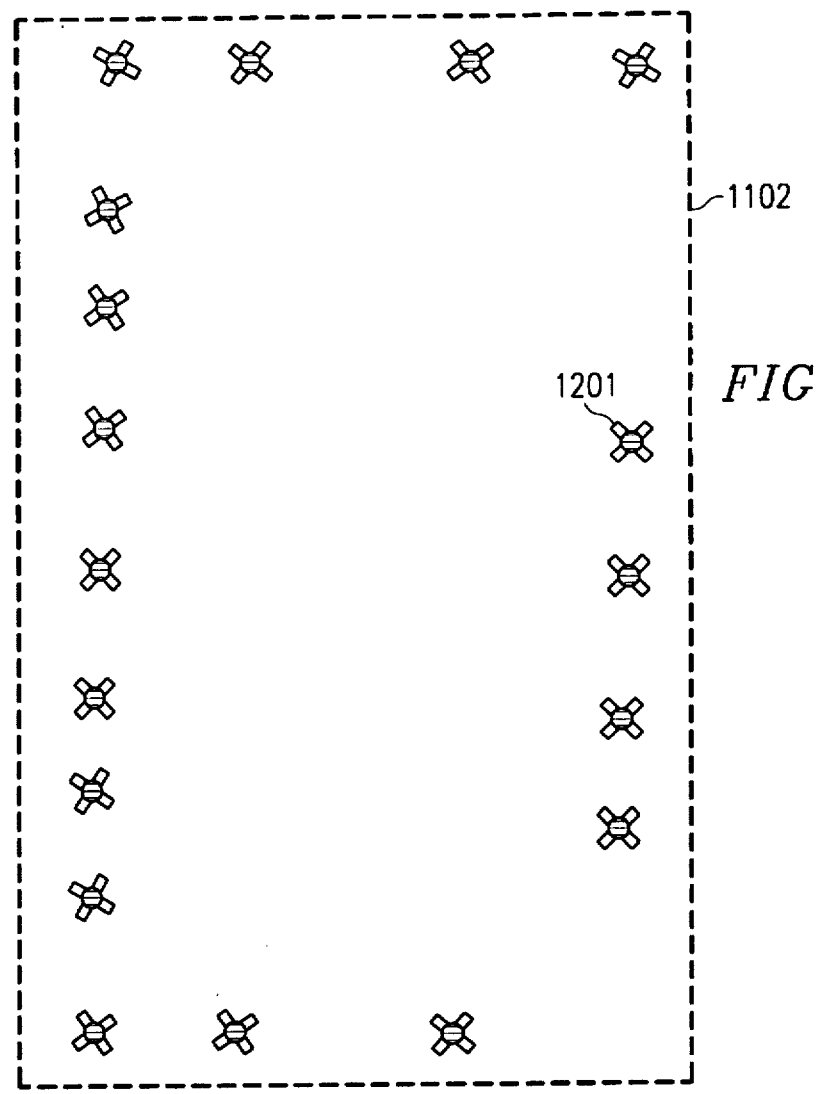
FIG. 12 illustrates a single build target pattern of the preferred embodiment.

A single needle placement pattern 1102 of one embodiment of the present invention is illustrated in FIG. 12. Each build target 1201 in the placement pattern is in the shape of a "fat" plus sign. The build target 1201 is rotated so that the probe needle shaft 202 does not obscure the pattern. The plus sign design of the build target 1201 provides a visual aid that helps the probe card technician place the probe needle tip 205 so that it makes initial contact with the build target 1201 in the center of the pattern 1102.

Figure 13:
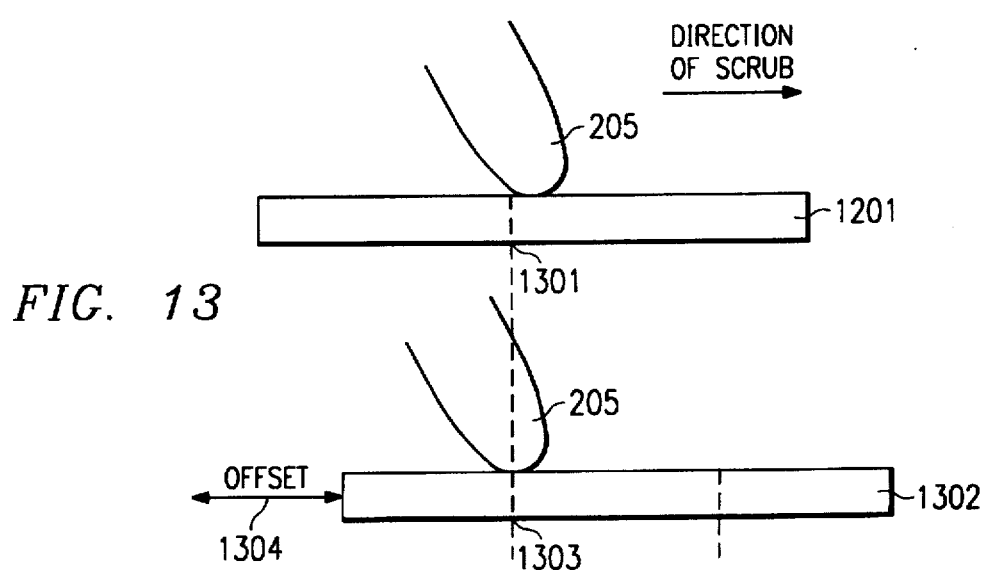
FIG. 13 illustrates the offset of the build target of the preferred embodiment.

Each build target 1201 is pre-positioned so that its center is located at a point approximately ⅓ of the way across the actual wafer bonding pad, as shown in FIG. 13. By positioning the probe needle tip 205 in the center 1301 of the build target 1201, the probe technician will accurately and consistently position the probe needle so that it scrubs the wafer bonding pads 1302 starting at a point ⅓ of the way across the bonding pad (point 1303) during the probing of the actual wafers. The build target 1201 is offset an amount 1304 from the coordinates of the actual wafer bonding pad 1302.

The build wafers can be ordered and constructed (based on the designer's bonding pad coordinates) before the finished product is available for testing. Probe cards can be built and checked before the product comes on line, decreasing the time to marketplace for new designs. Each build target is made of a hard metal (such as chromium) that is resistant to scratching. Instead of using (and ruining) real wafers during the mounting process, the technicians may use and re-use the hard build targets, reducing the cost of testing and production. Build wafers can survive repeated builds without pad damage or obscurement. Further, presetting the build targets the ideal offset distance from the bonding pad center allows automatic and consistent offset probe needle placement.

Figure 8:
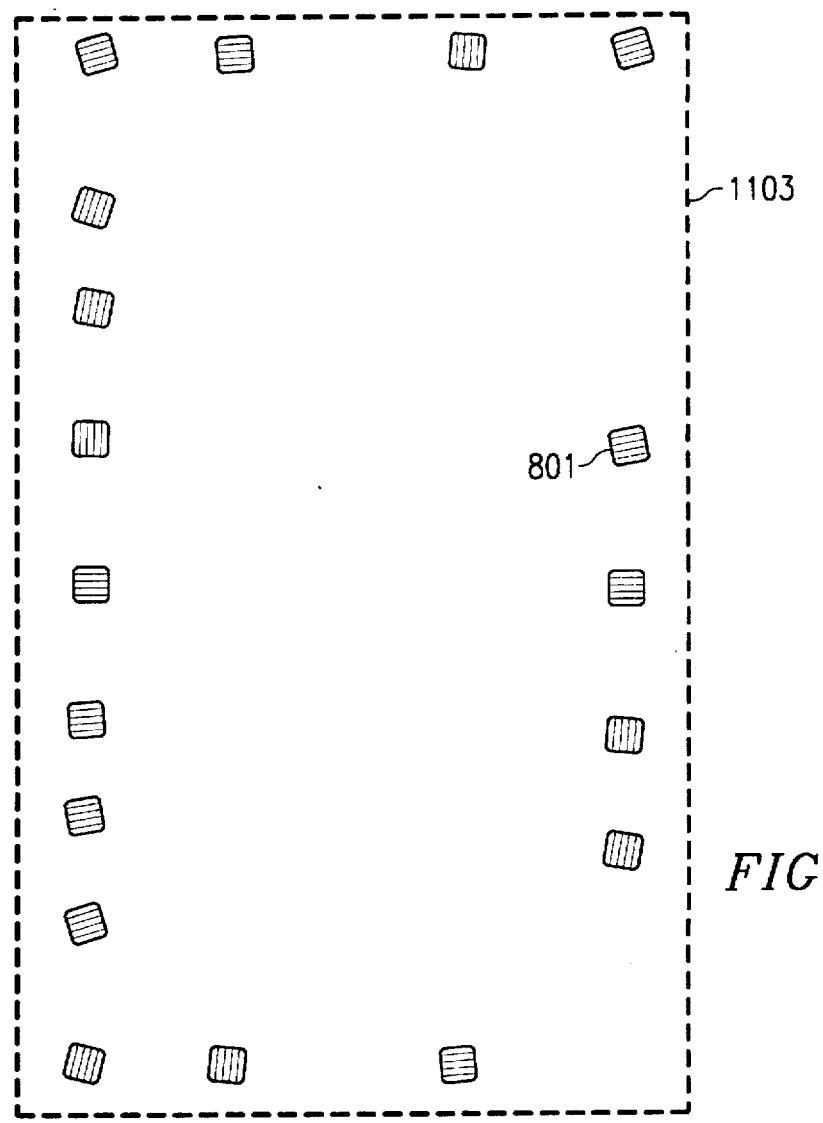
FIG. 8 illustrates a single scrub target pattern of the preferred embodiment.

A single probe needle scrub target and analysis pattern 1103 is illustrated in FIG. 8. In the preferred embodiment, each scrub target 801 is a "waffle" matrix of crossing lines. Each scrub target 801 is rotated so that each probe needle scrubs perpendicularly to one set of lines, and parallel to the other set of lines. In the preferred embodiment, each line of the scrub target is comprised of a soft metal (such as aluminum) that may be broken by the scrubbing action of the probe needle. The crossing lines are accurately spaced at a preset interval. In the preferred embodiment, the lines are spaced at 0.5 mils, although other spacings can be used.

During probe card footprint analysis, the technician lowers the probe card onto one of the scrub target and analysis patterns 1103 located on the build wafer. After the specified over-travel is applied, the location and magnitude of the resulting aluminum line displacement is analyzed and/or counted. If the amount of lines cut by the scrubbing action is more or less than the specified limits allow, then the scrub mark is considered to be outside the acceptable limits and the probe needle is adjusted. If the the location of the mark is outside of the acceptable limits, then the scrub mark is similarly considered outside the acceptable limits and the probe needle is readjusted.

For example, if the ideal scrub mark is 1.5 mils in length, and the line spacing on each scrub target 1001 is 0.5 mils, then the technician may be instructed to adjust the probe needles so that at least two lines, and no more than four lines, are broken by each probe needle's scrub mark. With the aid of a microscope, the technician will inspect each scrub target 1001 and adjust or replace each probe needle, using the tweaking tool of the present invention, so that every scrub mark is within this range.

The scrub target of the present invention allows a scrub mark analysis that is far superior to a simple planarity check, since a planarity check cannot insure a consistent pattern of good scrub marks. Various patterns or metals can be used for either the scrub or build targets without departing from the spirt and scope of the present invention. For example, for the scrub target, a bulls-eye pattern, a checker board pattern, a circular pattern, or a stripped pattern could all be used. Any medium that permits the accurate analysis of the scrub mark is sufficient. A generic silver metal wafer or plate with repeating graticules or distance meters, outlined by a non-reflective color (or black), would allow scrub mark analysis without the need for pad coordinates, computer set-up, and lag time to delivery, all at a reduced cost. Similarly, various target offset distances and patterns could be used for the build target to achieve different results depending upon the particular probing or tip size/shape requirements.

Thus, a method and apparatus for mounting, inspecting, and adjusting probe card needles is described for adjusting the planarity of a probe needle tip. Although specific embodiments, materials, designs, components and dimensions have been specified herein, the present invention is not limited to these specific examples. Alternative embodiments encompassing the inventive features of the present invention will be apparent to those skilled in the art, and are intended to be included within the scope of this invention.

I claim:

1. A stand alone tool for producing a point bend in a needle having a tapered portion and an untapered portion, said stand alone tool comprising:

needle receiving means comprising a base having first and second sides, said needle receiving means having an opening sized to no larger than 0.012 inches formed therein only on said first side of said base, wherein said opening is approximately equal to the thickness of said untapered portion, and wherein said opening is greater than the thickness of said tapered portion;

levering means comprising only one elongated member, said elongated member having first and second ends, said first end attached to said base such that an angle between said levering means and said second side of said base is less than 180 degrees;

wherein said stand alone tool produces said point bend in said untapered portion of said needle without producing said point bend in said tapered portion of said needle.

2. The tool of claim 1 where in said needle receiving means comprises three extended members fixedly attached to said first side of said base in an orthogonal manner to said base.

3. The tool of claim 2 wherein the longitudinal axes of said extended members are not coplanar.

4. The tool of claim 2 wherein said extended members are cylindrical.

5. The tool of claim 2 wherein a first one of said extended members is coplanar with said elongated member and positioned a greater distance from said first end than said second and third extended members.

6. The tool of claim 5 wherein the longitudinal axis of said first extended member is equidistant from the longitudinal axes of said second and third extended members.

7. The tool of claim 6 wherein the longitudinal axis of said second extended member is equidistant from the longitudinal axes of said first and third extended members.

8. The tool of claim 6 wherein the distance between said first extended member and a plane formed by said second and third extended members is approximately 0.01 inches.

9. The tool of claim 6 wherein the distance between said first extended member and a plane formed by said second and third extended members is approximately 0.012 inches.

10. The tool of claim 1 where in said needle receiving means comprises three extended members fixedly attached to said first side of said base in an orthogonal manner to said base.

11. The tool of claim 10 wherein the longitudinal axes of said plurality of extended members are not coplanar.

12. The tool of claim 11 wherein said plurality of extended members are cylindrical.

13. The tool of claim 11 wherein a first one of said extended members is coplanar with said elongated member and positioned a greater distance from said first end than the remaining extended members.

14. The tool of claim 10 wherein said opening measures approximately 0.01 inches.

15. The tool of claim 10 wherein said opening measures approximately 0.012 inches.

16. A stand alone tool for adjusting a needle producing said point bend in a needle having a tapered portion and an untapered portion, said stand alone tool comprising:

needle receiving means including a base having first and second sides, said needle receiving means comprising three extended members fixedly attached to said first side, said extended members defining an opening being sized no larger than 0.012 inches, wherein said opening is approximately equal to the thickness of said untapered portion, and wherein said opening is greater than the thickness of said tapered portion;

elongated member having first and second ends, said first end attached to said base of said needle receiving means such that the longitudinal axis of said elongated member forms an angle with said second side of said base wherein said angle measures less than 180 degrees;

wherein said stand alone tool produces said point bend in said untapered portion of said needle without producing said point bend in said tapered portion of said needle.

17. The tool of claim 16 wherein said opening measures approximately 0.01 inches.

18. The tool of claim 16 wherein said opening measures approximately 0.012 inches.

19. The tool of claim 16 wherein said extended members are orthogonal to said base.

20. The tool of claim 19 wherein said extended members are cylindrical.

21. The tool of claim 19 wherein a first extended member is positioned a greater distance from said first end than the remaining extended members.

22. The tool of claim 21 wherein the longitudinal axis of said first extended member is coplanar with the longitudinal axis of said elongated member.

23. The tool of claim 22 wherein the longitudinal axis of said first extended member is equidistant from the longitudinal axes of the remaining extended members.

24. The tool of claim 23 wherein the longitudinal axis of a second extended member is equidistant from the longitudinal axes of said first extended member and a third extended member.

* * * * *